United States Patent [19]
Golladay et al.

[11] Patent Number: 6,069,684
[45] Date of Patent: *May 30, 2000

[54] ELECTRON BEAM PROJECTION LITHOGRAPHY SYSTEM (EBPS)

[75] Inventors: Steven D. Golladay, Hopewell Junction; Paul F. Petric, Brewster, both of N.Y.; Hans C. Pfeiffer; Werner Stickel, both of Ridgefield, Conn.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/017,722

[22] Filed: Feb. 4, 1998

[51] Int. Cl.$^7$ .............................. G03B 27/42; A61N 5/00; G03C 5/00
[52] U.S. Cl. .......................... 355/53; 250/492.2; 430/269
[58] Field of Search ................................... 355/53, 67, 77; 250/396, 398, 492.2; 430/269

[56] References Cited

U.S. PATENT DOCUMENTS

| | | |
|---|---|---|
| 5,382,498 | 1/1995 | Berger . |
| 5,434,424 | 7/1995 | Stickel et al. . |
| 5,545,902 | 8/1996 | Pfeiffer et al. . |
| 5,633,507 | 5/1997 | Pfeiffer et al. . |
| 5,674,413 | 10/1997 | Pfeiffer et al. . |
| 5,708,274 | 1/1998 | Langner et al. .......................... 250/396 |

*Primary Examiner*—David M. Gray
*Assistant Examiner*—Peter B. Kim
*Attorney, Agent, or Firm*—Whitham, Curtis & Whitham; Eric W. Petraske, Esq.

[57] ABSTRACT

Numerous largely unpredictable criticalities of operating parameters arise in electron beam projection lithography systems to maintain throughput comparable to optical projection lithography systems as minimum feature size is reduced below one-half micron and resolution requirements are increased. Using an electron beam projection lithography system having a high emittance electron source, variable axis lenses, curvilinear beam trajectory and constant reticle and/or target motion in a dual scanning mode wherein the target and/or wafer is constantly moved orthogonally to the direction of beam scan, high throughput is obtained consistent with 0.1 $\mu$m feature size ground rules utilizing a column length of greater than 400 mm, a beam current of between about 4 and 35 $\mu$A, a beam energy of between about 75 and 175 kV, a sub-field size between about 0.1 and 0.5 mm at the target at an optical reduction factor between about 3:1 and 5:1, a numerical aperture greater than 2 mrad and preferably between about 3 and 8 mrad and a scan length between about 20 mm and 55 mm. Reticle and target speed preferably differ by about the optical reduction factor.

18 Claims, 2 Drawing Sheets

ELECTRON BEAM PROJECTION LITHOGRAPHY SYSTEM (EBPS)

BACKGROUND OF THE INVENTION

1. Field of the Invention

The present invention generally relates to the manufacture of semiconductor devices and integrated circuits and, more particularly, to lithographic processes and tools for making lithographic resist exposure with an electron beam.

2. Description of the Prior Art

Lithographic processes are generally required in the manufacture of semiconductor integrated circuits. Even though there is a trend in the manufacture of integrated circuits to employ processes and element designs in which many processes are carried out in a self-aligned manner (both to avoid some lithographic processes and to produce structures at smaller size than can be accomplished lithographically), at least one lithographic process to define element locations is invariably required. A lithographic process, itself requires multiple steps of at least applying a resist, drying the resist, exposing the resist, developing the resist and then performing a material deposition or removal process, all of which are relatively time-consuming. Therefore, the lithographic processes are often a limiting factor in production line throughput.

Additionally, the small feature sizes of modern and foreseeable integrated circuits require extremely high-resolution exposures of the resist to be made. The lithographic technology almost exclusively in use in the industry at the present time is based on the use of light (radiation) as the exposure medium to expose the resist. Optical technology has advanced to the point that resolution is essentially limited by diffraction (or, more generally, interference effects of the radiation) but not significantly by imperfections of the optics known as aberrations. Diffraction is determined by the wavelength of the light used to expose the resist and is of generally lesser impact at shorter wavelengths.

Accordingly, the trend in the industry has been toward the use of shorter wavelengths of electromagnetic radiation to accommodate advances in integrated circuit manufacture allowing smaller dimensions and closer proximity of circuit elements. The current consensus in the industry is that the use of light is restricted to a wavelength of 193 nm (nanometers) which is in the deep ultra-violet (DUV) range and is believed to provide a maximum resolution supporting minimum pattern dimensions of between 130 and 180 nm.

Major efforts beyond this feature size limit are directed toward use of an extended range of electromagnetic radiation having wavelengths in the extreme ultra-violet (EUV) range and even X-rays. Use of charged particle (electron or ion) radiation, however, provides an alternative exposure medium for high resolution lithography. Use of either electrons or ions is not limited by diffraction effects but by other factors at the present state of the art. Such other factors include aberrations which are the equivalent of optical aberrations, often referred to as geometric aberrations, Coulomb interactions between the like-charged particles and interaction with the materials of the target toward which the particles are directed which results in scattering of the particles, causing an exposure effect known as proximity effect. While these effects are common to beams of either electrons or ions, electron beams are of primary interest in this context.

It is well-known that electron beams are readily controllable by magnetic and electric fields in the vicinity of the beam. Such control has been exploited for lithography in industry and research for about thirty years almost exclusively in configurations known as probe-forming systems. The term "probe" is used to indicate that the electron beam is formed in an electron optical column to produce a tiny spot at the target of the size of a few micrometers or less. This spot is then controlled in space and time by electric and/or magnetic fields to generate a desired pattern such as of a desired circuit pattern. However, to delineate a desired pattern over a chip of transverse dimensions in the range of several millimeters, the exposure is essentially a sequential process carried out over many thousands or millions of spots or "pixels" (although, as a practical matter, a spot can contain more than one pixel, for example, about 100 pixels in a shaped beam system; the term "pixel" being more generally equated with system resolution) and is therefore much more time-consuming than an exposure in an optical system in which an entire chip pattern can be exposed in a single flash. Aberrations can be controlled to some degree in probe-forming systems by applying corrections on a pixel-by-pixel basis as the sequential exposures of respective areas of the target are made.

In manufacture, the time required by a process and the throughput of apparatus with which the process is conducted is critical to the efficiency of the process. Consequently, electron beams have only been used for integrated circuit lithography in environments where the advantage of controllability by electric and magnetic fields is favorably balanced against their lack of high throughput. While direct exposure of chips on silicon wafers with electron beams has been in limited use for some years by a few manufacturers, e-beam systems are primarily employed in the fabrication of patterned optical masks for lithography systems employing projection of electromagnetic radiation.

To reduce the limitation on throughput of probe-forming systems, electron beam projection systems modeled on optical projection systems have been developed which shape the electron beam in accordance with a potentially complex mask referred to as a reticle, thus ideally projecting all pixels of the reticle in parallel. The use of demagnification allows very small feature sizes and fine pitches which may be smaller than feature sizes in the reticle and potentially smaller than may be available from spot exposures. However, some practical limitations of projection systems are encountered at even relatively small reticle sizes and relatively low throughputs. For example, correction of aberrations cannot be applied on a pixel-by-pixel basis as in probe-forming systems and the current state of the art does not support a lens which will cover a field corresponding to a reticle of 80×160 mm (corresponding to a 20×40 mm image at 4:1 linear demagnification) with sufficient fidelity to meet 0.25 micron or smaller feature size ground rules. Further, the electron emitting surface of the cathode electron source is imaged at the reticle and the physical size of the cathode required to produce sufficiently uniform illumination across the entire reticle is not available at the present time.

Accordingly, it has been proposed in U.S. Pat. No. 5,466,904, to Pfeiffer et al., assigned to the assignee of the present invention and fully incorporated by reference, to scan an electron beam across sub-sections of the reticle to reduce beam current requirements while allowing substantial aberration correction for respective sub-sections or sub-fields of the reticle and target plane. Substantial increase in throughput relative to probe-forming systems is supported since the respective exposures need not be made on a spot-by-spot basis (as the spot formed by the probe-forming system has been defined above) in serial step-and-repeat (S&R) fashion and the system is capable of exposing about $10^7$ pixels in parallel per sub-field while applying aberration corrections on a subfield-by-subfield basis.

Other fundamental functional elements in electron beam projection systems include the electron beam source structure such as that disclosed in U.S. Pat. No. 5,633,507, to Pfeiffer et al., and a lens arrangement by which the electron beam may be confined to a curvilinear axis which lies within a plane including the axis of the e-beam column (but is not constrained to do so) such as that disclosed in U.S. Pat. No. 5,635,719 to Petric (both of which are also assigned to the assignee of the present invention and fully incorporated by reference). U.S. Patent applications (Attorney Docket Nos. FI9-96-124, FI9-96-125, FI9-96-135 and FI9-97-033) also relate to curvilinear axis systems and are also fully incorporated by reference. The technique of the curvilinear axis disclosed in U.S. Pat. No. 5,635,719 to Petric may also be applied to a portion of the column serving to illuminate the reticle subfields in on-axis and off-axis locations to provide a wide scanning range without significant deterioration of the illumination uniformity.

Additionally, scattering of the electron beam in the reticle may be reduced in accordance with U.S. Pat. No. 5,674,413 to Pfeiffer et al., also assigned to the assignee of the present invention and incorporated by reference, thereby substantially increasing the beam current available for exposure and, accordingly, the throughput of the tool. Further, it is preferred to use as high an acceleration voltage as may be compatible with the beam imaging and positioning control electronics to reduce the resolution-limiting Coulomb interactions. A limit of about 180 kV is considered to be imposed by the possibility of damage to the reticle or wafer and structures previously formed thereon.

To reduce deflection requirements and accommodate both larger exposure fields on a wafer and the sequential processing of plural wafers, movement of the reticle and/or wafers is generally provided. Continuous circular motion of the reticle in combination with stepping motion of the wafer to reduce high movement speed of the reticle generally required in known reduction projection systems is disclosed in U.S. Pat. No. 5,434,424 to Stickel et al. A planar stage design to simplify the mechanical construction of the reticle or wafer stage to reduce weight and increase robustness as is required to meet high resolution requirements and accordingly minimize non-exposure time is disclosed in U.S. Pat. No. 5,140,242 to Doran et al. To reduce the vibrational interaction between the accelerating and decelerating reticle and wafer stages and the electron-optical column to improve system stability and exposure accuracy, a preferred frame design is disclosed in U.S. Pat. No. 5,508,518 to Kendall. All three of these patents are hereby fully incorporated by reference.

Combinations of some of these fundamental elements of an electron beam projection system deliver good results and high throughput for quarter micron or potentially much smaller feature size ground rules (e.g. 0.1 $\mu$m) over a substantial range of operating conditions which may be chosen and adjusted at will by those skilled in the art to derive excellent lithographic results. However, while specific forms of these fundamental elements described in the U.S. Patents and Patent Applications incorporated by reference above are directed to improvement of resolution, reliability or speed of operation, it has not been demonstrated that these elements will fully cooperate to unconditionally provide high resolution and, simultaneously, high throughput, adequate for current and foreseeable integrated circuit designs and ground rules. On the contrary, unpredictable criticalities have been found to arise at smaller feature size ground rule regimes. Specifically, both the physical configuration and operating conditions of the e-beam projection system in relation to external factors such as resist sensitivity and internal factors, which include but are not limited to geometric aberrations, Coulomb interactions and electronic signal-to-noise ratio, impose significant trade-offs between e-beam column length and image reduction factor, beam current, beam accelerating voltage, beam scanning range, numerical aperture, subfield size, reticle and wafer stage velocity and accuracy and speed of control electronics for control of the beam and/or the reticle and/or target (e.g. wafer) transport mechanisms.

The combination of these trade-offs reflect a very complex system of interactions between the key parameters of physical configuration and operating conditions of each of the above fundamental elements (and potentially other elements) in combination which become extremely critical to provide performance in terms of throughput, feature resolution, linewidth and pattern overlay control required for lithography commensurate with manufacturing ground rules of 0.18 $\mu$m critical dimension (CD) technology and smaller. In other words, to use a system including the technologies of the above-noted preferred fundamental elements to feature size ground rule regimes significantly smaller than a quarter-micron ground rule requires consideration and management of a system of interactions which is intractably large and complex and seemingly insusceptible of mathematical analysis. Development of empirical parameters in regard to physical configuration and operating conditions of each element and accounting for all interactions requires a significant number of experiments or simulations. No engineering analysis of the performance of an e-beam projection system comprehending all of the above-noted parameters and operating modes has been accomplished prior to the present invention.

For example, considering the fact that aberrations (such as those due to Coulomb interactions between like-charged electrons) and other positional errors will be present in some degree in all practical charged particle systems and that an acceptable aberration for a given feature size regime has to remain the same or an even smaller fraction of the feature size as the feature size is reduced, it may seem desirable to reduce aberrations by increasing the acceleration voltage of the electron beam which is known to reduce some aberrations. However, increasing the acceleration voltage effectively reduces resist sensitivity, for which increased beam current might be used to compensate to maintain throughput. Increased beam current increases Coulomb interactions between electrons and resultant aberrations, yielding only relatively slight gains while increasing the power dissipation requirements at beam-limiting diaphragms or apertures and of beam positioning and deflection devices, ultimately affecting beam stability and placement accuracy. Heating of the wafer or portions thereof causes uncontrollable changes in the resist chemistry and/or expansion and distortion of the wafer which may result in so-called overlay errors in the exposure pattern in quantitative dependence on beam placement, resist sensitivity and the like.

In the same manner, deflection errors tend to increase with the angular deflection of the electron beam and, to cover larger exposure fields (to the extent that larger exposure fields can be accommodated by lenses available within the level of present skill in the art), angular deflection can be reduced by increase of length of the e-beam column to maintain deflection displacements at smaller deflection angles. However, increase of the e-beam column length increases geometric aberrations as well as those due to Coulomb interactions. Compensation by scaling of the electron beam energy or accelerating voltage compromises throughput unless the beam current is further increased which may, in turn, compromise resolution and overlay accuracy, as discussed above. Again, the quantitative change in aberrations is also affected by magnification, lens configuration and the like in addition to the trade-off between field size and lens and corrector accuracy and the accuracy of positioning systems (which exhibit a limitation given by the speed-accuracy product of their design) for the reticle and wafer.

Thus, it can be appreciated that the physical configuration and operating parameters needed to apply the preferred, known, technologies discussed in the above-incorporated U.S. Patents and Patent Applications, in combination, to lithographic processes in smaller than quarter micron regimes is not at all straightforward, much less leading toward optimization, and the level of skill in the art does not assure success of any particular combination of structures of fundamental system elements at smaller feature size regimes consistent with maintaining an acceptable throughput of the system, much less a throughput comparable to optical exposure systems.

An approach to the complexity of this problem disclosed in U.S. Pat. No. 5,382,498 to Berger seeks to reduce the number of elements, conditions and interactions considered while extending electron beam projection lithography to smaller regimes and maintaining an acceptable level of throughput. Essentially, Berger is directed to a much larger feature size (half-micron) regime than discussed above and, beginning with the recognition that an effective limit of about 0.75 meters is imposed on e-beam column length at a relatively low beam current density of 10 mA/cm$^2$ at the substrate due to Coulomb interactions, then rigorously optimizes the beam energy between effects of Coulomb interactions and thermal effects for a given resist sensitivity and reticle and wafer heat dissipation and coefficients of thermal expansion and elasticity. Adjustment of dwell time and the use of repeated scans is utilized in Berger to keep overlay error within acceptable limits but, understandably, may compromise throughput. Dwell time must also be coordinated with reticle and wafer movement to prevent image blurring at the wafer.

While Berger may be effective to produce acceptable results with acceptable throughput in half-micron feature size regimes, it does not provide a methodology to derive high throughput consistent with high resolution which is necessarily effective in the much smaller feature size regimes now required. Neither does Berger provide guidance toward suitable operating parameter ranges for fundamental elements of the lithography tool in combination or lead to any methodology for ensuring success of lithographic processes in such regimes, much less optimization thereof for maximized throughput and manufacturing yield at a required resolution in those regimes.

SUMMARY OF THE INVENTION

It is therefore an object of the present invention to provide an e-beam exposure tool having resolution sufficient for feature size regimes significantly smaller than quarter-micron with throughput comparable to optical exposure systems.

It is another object of the invention to provide ranges of physical configuration and operating parameters for fundamental elements of an electron beam lithographic exposure system, in combination, which will reliably provide high resolution and high throughput in feature size significantly smaller than quarter-micron regimes.

In order to accomplish these and other objects of the invention, an electron beam projection system and method for making lithographic exposures are provided including a deflection arrangement for scanning an electron beam orthogonally to a direction of motion of a target, an arrangement for exposing a portion of a reticle with an electron source image corresponding to an image at the target having a transverse dimension of at least approximately 0.1 mm at a numerical aperture greater than 2 milliradians. A column length greater than 400 mm, a beam current of between about 4 and 35 $\mu$A, a beam energy of between approximately 75 and 175 kV, a sub-field size between about 0.1 and 0.5 mm at the target at an optical reduction factor between about 3:1 and 5:1, a numerical aperture preferably between 3 and 8 mrad and a scan length between about 20 mm and 55 mm are preferred.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
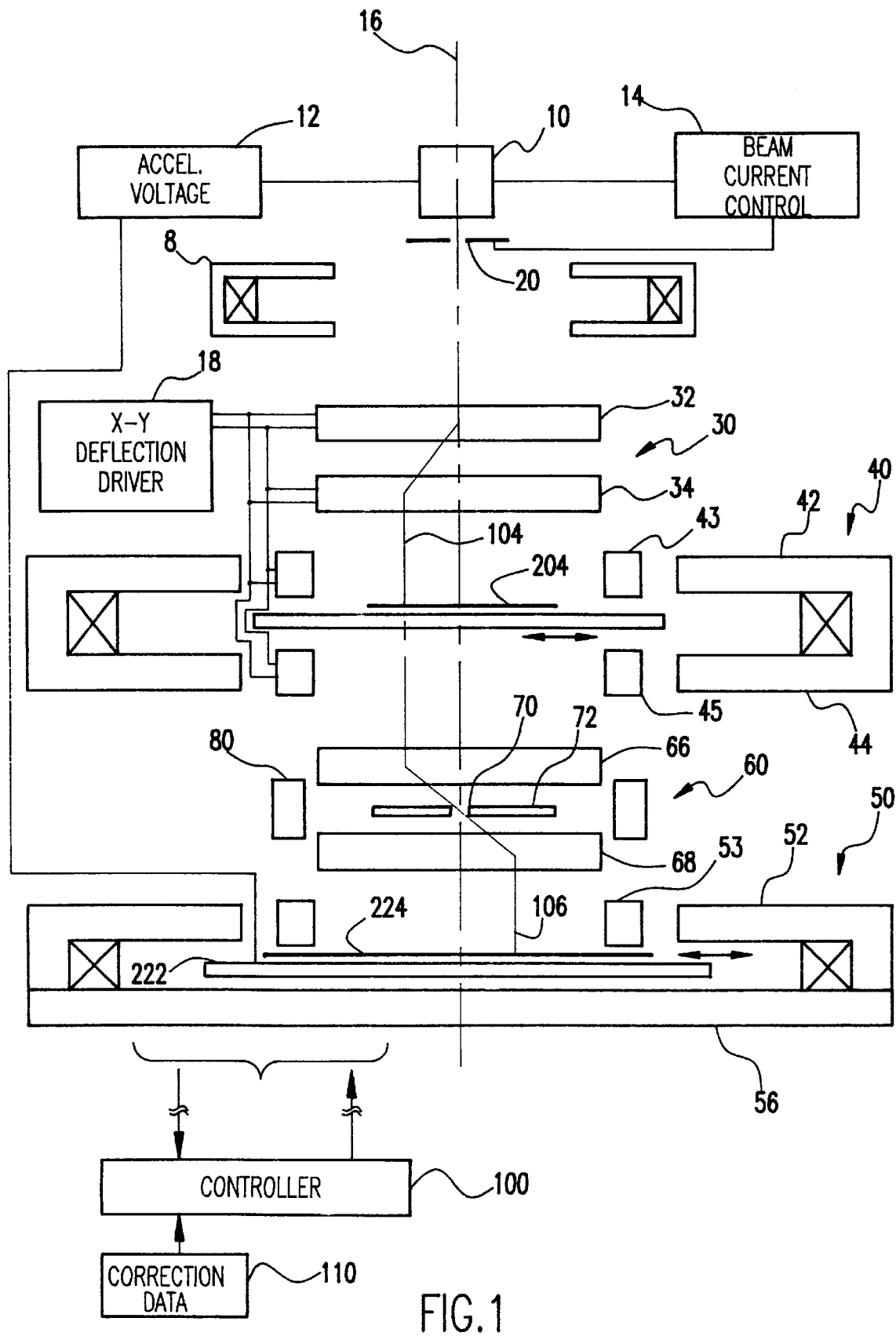
FIG. 1 is a schematic cross-sectional view of an electron beam lithographic exposure system in accordance with the invention.

Referring now to the drawings, and more particularly to FIG. 1, there is schematically shown, in cross-section, an electron beam projection system to which the invention is applicable. This e-beam projection system is similar to that described in the above-incorporated U.S. Pat. No. 5,545,902 to which the present invention may be applied. The form of illustration is highly schematic and simplified in the interest of readily conveying an understanding of the invention. The invention is, however, applicable to other e-beam projection systems, such as that disclosed in the above-incorporated U.S. Pat. No. 5,635,719, and including fundamental elements advantageously incorporating particular forms thereof described in the above-incorporated U.S. Patents and Patent Applications as will be understood by those skilled in the art in light of the following description of the invention. It is also to be understood that while the basic combination of fundamental elements depicted in FIG. 1 is known, as are the elements themselves, the invention is directed to particular configurations of a combination of particular forms of these fundamental elements and interrelated operating parameters thereof. Accordingly, FIG. 1, which is highly schematic and not to scale, is not admitted to be prior art as to the present invention.

As shown in FIG. 1, electron source 10 emits a diverging beam toward illuminating aperture 20 to develop an electron beam having an energy determined by accelerating voltage supply 12 and current controlled as schematically indicated at 14. Aperture 20 is preferably square with a non-critical nominal dimension of about 1.0 mm on a side. The aperture dimensions are preferably chosen to provide a desired degree of uniformity (generally a variation of 2% or less) of electron density across the aperture while the diverging beam emitted by electron source 10 will generally have an electron density distribution which is symmetrical about system axis 16 and approximately Gaussian. The electron beam is then focussed by lens 8 such that an image of aperture 20 is generated at the reticle. The size of the image of aperture 20 at the reticle is chosen to match or slightly exceed the size of the subfield by adjusting position and excitation of lens 8, which could, alternatively, be replaced by a group of multiple lenses.

Deflector 30 is preferably comprised of deflection coil arrangements 32 and 34 but electrostatic deflection plates or a combination thereof could also be used, as is well-understood in the art. In any case, deflector 30 is comprised of a spaced pair of devices which are oppositely driven (but possibly scaled in driving current or voltage in accordance with their individual configuration) by deflection driver 18 in order to return the deflected beam to a trajectory 104 which is parallel to system axis 16. Trajectory 104 will thus intersect a selected subfield of the reticle 204 and is referred to for convenience as the reticle axis although it is to be understood that the term applies to the trajectory of the beam through any selected reticle subfield.

Lens 40, which focuses the beam at the plane of reticle 204, is a preferably a variable axis lens (VAL) and most preferably a variable axis immersion lens (VAIL) in which the object/reticle is preferably "immersed" in the focussing field defining the lens. However, it is to be understood that the geometry of the beam column and relative positioning of elements therein may be tailored to particular applications and the reticle need not be immersed in the lens field).

The VAIL preferably has upper and lower pole pieces 42 and 44 and axis-shifting yokes 43, 45. Both VAL and VAIL types of lenses are well-understood in the art and are capable of shifting the axis of the lens controllably to coincide with reticle axis 104 in accordance with selective deflection, discussed above. The axis shifting yokes 43 and 45 are thus schematically depicted as being driven by deflection driver 18 although, in practice, they would be separately driven but responsive to the same control signal. (Other connections of elements of the system described below for driving other deflection, focussing and corrections elements which are otherwise omitted in the interest of clarity are schematically depicted by correction data storage device 110 and controller 100 which may be considered as being partially included by X-Y deflection driver 18. Their connection and driving requirements will be well-understood by those skilled in the art from the above discussion.) Shifting of the lens axis substantially eliminates off-axis aberrations consistent with the high resolution performance required of the system.

The focussing of the electron beam 104 on the reticle 204 thus illuminates the reticle with an image of aperture 20 which may be coincident in size with a subfield of the reticle (or slightly larger) which will generally be larger than that of the image at the wafer assuming demagnification is employed. As the beam passes through portions of the reticle (the remainder being absorbed or, preferably, scattered) it is shaped into an image determined by the patterning of the reticle. The beam is collimated by lens 40 which (with lens 50) also thus affects focussing.

Another deflector 66 deflects the beam back to a stationary aperture 70 (which allows a single aperture at a "pivot point" to be used rather than an aperture-for each sub-field as would be required if the beam did not again cross the beam column axis). This aperture again clips the electrons in the edges of the electron density distribution profile (due, in part, to scattering at the reticle) to enhance contrast and limit size of the image of source 10/aperture 20. Beam current can also be sensed at the aperture for alignment and other dynamic corrections. The use of a single aperture may, if desired, also provide the advantage of allowing stationary and symmetric placement of elements, collectively depicted at 80, for dynamic correction of aberrations such as field curvature, astigmatism and distortion, relative to the system axis and co-planar with aperture 70. Deflector 68 returns the beam to a trajectory 106 parallel to the beam column axis. Deflector pair 66, 68 is collectively indicated at 60.

Variable axis focussing lens 50 (including pole pieces 52 and 56 and axis shifting element or yoke 53, in conjunction with the lower portion of lens 40 provides the overall demagnification of the system. Accordingly, as is understood by those skilled in the art, reticle 204 need not be placed symmetrically within lens 40 but could, for example, be placed upstream of lens 40. In either case both lenses 40 and 50 function as a lens doublet. The electron beam, patterned by reticle 204 is thus projected onto target wafer 224, carried by a positional translation table 222 which reduces the field coverage requirements of the system.

In systems of the general type discussed above, there are four classes of performance-limiting factors which narrow the configuration and operating parameter ranges within which an electron beam projection system (EBPS) can operate to provide suitable resolution at sub-quarter-micron feature size regimes with acceptable throughput. The first two classes are specific to charged particle systems: electrostatic or Coulomb interactions between like-charged particles in the beam and between the beam and solid materials constituting components of the tool, the reticle and the wafer and the geometrical aberrations arising from the imperfect ability to maintain all charged particles in the beam simultaneously on their ideal trajectory throughout the beam column by the lenses, deflectors and multi-pole correctors employed, none of which is practically ideal in configuration or produces a theoretically ideal (i.e. without aberrations) or perfect (i.e. without fabrication deficiencies and corresponding distortions) field.

The second two classes of performance limiting factors arise from imperfect mechanical positioning of the reticle and target, respectively; each of which has its own speed-accuracy product of design (comparable to the gain-bandwidth product of an electrical circuit) and both of which have their movements synchronized with each other.

The inventors have recognized that the ultimate throughput-resolution product of the overall system and tool represents a summation of the speed and positional/aberration inaccuracies of these four classes of performance limiting factors and have analyzed the trade-offs in each relative to all of the above-noted key parameters (e-beam column length and reduction factor, beam accelerating voltage, beam current, beam scanning range, numerical aperture, subfield size, reticle and wafer stage velocity and accuracy and speed of control electronics) as they relate to each class of performance limiting factors and have derived the following operating modes and ranges of parameters as fundamental conditions for obtaining resolution sufficient to feature size regimes of 0.18 $\mu$m and smaller consistent with throughput of EBPS tools comparable to optical projection systems. Further, in the following discussion, it will be noted that the preferred value ranges for each of the key operating parameters are primarily functions of the effect of that parameter and a number of predominant other parameters on particular classes of performance-limiting factors discussed above.

First, considering the operating mode and principles of the system in accordance with the invention, it is preferred that the system be operated in one of two dual-scanning modes in regard to target and/or reticle position translation. Specifically, it is preferred that the beam move across the reticle in essentially one direction (e.g. x) while the target and/or reticle move continuously in a direction orthogonal thereto (e.g. y at an angle to x given by the center-to-center distance between adjacent subfields in the y-direction divided by the beam deflection or scanning range in the x-direction) and in opposite directions. In such a case, the movement of the target should be slower than the movement of the reticle by about either the optical reduction factor or the ratio between the beam scanning range at the reticle and the beam scanning range at the wafer of the system. The operating conditions in accordance with the invention are also consistent with linear movement of only the target while the reticle rotates around a stationary axis, as described in the above-incorporated U.S. Pat. No. 5,434,424 and constituting a second preferred dual-scanning mode. In either case, a serpentine or pedestal scanning pattern is preferred for both beam scanning and target motion (and reticle motion, if linear) to avoid the time and speed-accuracy product required to achieve "flyback".

The speed of the reticle as well as the target, in either case, is slow compared to beam deflection speed since the stages only advance by one subfield center-to-center distance (generally about the same as subfield width except that gaps can be provided between subfields on the reticle) for every scan of the beam across its deflection range of field orthogonal to the stage motion. The beam motion together with the reticle and/or wafer motion constitute a "stripe"; the width of which is given by the beam scanning range or (one-dimensional) deflection field and the length of which is given by the chip dimension corresponding to the stage motion orthogonal thereto.

It can be readily appreciated that the step-and-repeat (S&R) mode of operation employed in some prior known probe-forming systems, where two-dimensional beam deflection fields are either stitched together to cover a chip or, if as large as the chip, cover the wafer chip-by-chip, is unsuitable for high throughput applications due to the delays between fields required to provide settling time for the stage(s) between steps. These delays are in addition to the intervals required at the stripe boundaries for the turn-around or reversal of the stage(s) following, for example, a pedestal raster scanning pattern, as alluded to above.

Using the above system operating principles, an exemplary throughput of about 30 (200 mm) wafers per hour is feasible in view of the reduction of demands on the speed accuracy product of the target and/or reticle translation arrangements achieved by the dual scanning mode of operation including continuous wafer and reticle motion. This level of throughput, however, requires the handling of wafers in batches since the time required for wafer-by-wafer loading and unloading operations into and out of a vacuum environment is incompatible with such a high throughput level.

Second, the operating conditions of the system in accordance with the invention will be discussed in turn with reference to FIGS. 2 and 3 in which parameter ranges considered to be acceptable in accordance with the invention are normalized on the horizontal axis and relative trends in resolution (expressed as image blurring, B, and image distortion, D, and throughput, respectively, and without units (and arbitrarily positioned) on the vertical axis. It should be understood that the ranges and limits indicated below to be preferred or considered to be acceptable are to be considered as the values beyond which resolution or throughput or both may be significantly compromised. That is, the likelihood of success in the production of both high resolution and throughput is markedly diminished as the stated limits are closely approached or exceeded. Of course, compensations for one or more parameters being chosen outside the preferred limits may be possible and made by adjustment of other parameters and stated limits should therefore be considered as approximate throughout the following discussion. Conversely, use of several parameters near stated preferred limits may make other stated preferred limits more critical. The stated approximate preferred ranges would, of course, be larger if lower resolution and/or throughput is acceptable. As will be discussed in more detail below, the fundamental premise of the design of the EBPS in accordance with the invention is that parameters are chosen within practical limits but that inverse proportionalities or counter trends of at least some parameters indicate and approximate optimum conditions.

In regard to a first of such parameters to be considered, the beam acceleration voltage, often referred to as the beam energy, several factors must be considered simultaneously. Experimental and theoretical evidence shows higher voltage to be favorable for system throughput which may be explained in the following way:

First to be considered is the dependency on the beam voltage of resist sensitivity in terms of the dose required to properly etch the pattern features into it. The resist sensitivity is known to decrease roughly proportionally with beam energy. In other words, the required dose increases roughly proportionally with acceleration voltage. However, to arrive at the optimum trade-off, the dependency on the voltage of image blur must be taken into account. The image blurring due to Coulomb interactions, which vary with the inverse power of about 1.6 as shown in trace 21 of FIG. 2. However, since the Coulomb interaction blurring increases with the beam current only with the power of about 0.8, as indicated by trace 22 in FIG. 2, overall resolution improves with the square of the acceleration voltage. Thus throughput increases roughly proportionally with the acceleration voltage while resolution is maintained, as illustrated by trace 28 in FIG. 3, which is expressed in the following equations:

$$\text{Dose} = I^* \, T/F \sim V$$

where I =beam current, T=exposure time, F=wafer area and V=voltage. Disregarding overhead for this consideration, throughput, TP, is proportional to 1/T and therefore, TP~I/V. Similarly expressed, image blurring, B~$I^{0.8}/V^{1.6}$, and, therefore, at constant blur, I~$V^2$, or TP~V.

A lower limit on beam accelerating voltage of 75 kV is preferred in view of Coulomb interactions and, of lesser but significant importance, proximity effects. Coulomb interactions vary with the inverse power of 1.6 with the voltage, as shown by curve 21 of FIG. 2. (i.e. doubling the voltage reduces the interaction blur by about a factor of 3). Coulomb interaction blur impacts linewidth or pattern fidelity control. Proximity effect is the undesired exposure of the resist from underneath due to backscattering of the electrons from the wafer substrate into pattern areas, where no exposure is wanted. The depth in the wafer, from the point where electrons reach the surface, increases with the voltage, therefore also increasing the lateral range around the impact location of the beam, which is exposed. At higher voltage the backscatter current is spread out more, the backscatter current density decreases and the proximity effect causes more of a general background exposure and thus a slight contrast reduction rather than local linewidth variations, which are most detrimental, especially at smaller pattern dimensions. There are methods to correct for the proximity effect, but only approximately and the lower the voltage, the less accurately correction can be done. Accordingly, an accelerating voltage significantly below 75 kV is not considered to be acceptable.

Similarly, an upper limit of 175 kV is preferred for beam accelerating voltage in view of possible substrate damage, the likelihood of which increases significantly beyond this limit since the atom knock-on energy for Si is around 180 keV, at which crystal damage may occur and such damage (probably) cannot be annealed out. Additionally, while not a fundamental problem but, nevertheless, an engineering challenge, the electronics gain-bandwidth product (GBP) implies that the higher the beam acceleration voltage, the higher the output amplitude (gain) that is required primarily of the deflector drivers and secondarily by the drivers for lenses, alignment and dynamic correction elements and the lower the available bandwidth of given beam control electronics. Therefore, 175 kV is considered a practical upper limit on beam energy.

It is now known by those skilled in the art that the beam current rather than current density (as implied in the above-cited U.S. Pat. No. 5,382,498 to Berger) is the primary factor determining throughput, provided that exposure time is dominant over the so-called overhead time, composed of electronic and mechanical delays (e.g. settling time, minimized in accordance with the invention by providing for continuous target and/or reticle motion and including acceleration and deceleration time at stripe end reversals of the pedestal raster, subfield-to-subfield step settling time of the electronics, load/unload time and global, chip-to-chip and stripe-to-stripe alignment). A preferred range of beam current is considered to be between 10 $\mu$A and 30–35 $\mu$A, as indicated by curve f(I) of FIG. 3. The lower limit is preferred as a value between aggressive and more realistic conditions. Specifically, at a resist sensitivity of 1 $\mu$C/cm$^2$, which at 100 kV is presently hypothetical, but which is presumably a fundamental limit due to shot noise affecting pattern fidelity, a current of 2–3 $\mu$A is required under aggressive conditions regarding the other system and operating parameters to achieve the exemplary throughput of 30 (200 mm diameter) wafers/hr throughput, noted above, at a subfield of 250 $\mu$m on a side with 50% pattern density (a maximum, assuming that for more than that one would use the complementary pattern with negative resist). At more realistic conditions (e.g. 5 $\mu$C/cm$^2$ resist sensitivity and less aggressive operating conditions), the current required increases to 12 $\mu$A for 30 wafers/hr.

An upper limit of 30 $\mu$A is preferred in view of (in decreasing order of importance) Coulomb interactions, reduced return on investment (regarding throughput), electronic and mechanical settling times, resist heating and total power dissipation. Specifically, the blur caused by Coulomb interactions is somewhat weaker than proportional to the current, as alluded to above and shown by the slight downward curve of trace 22 of FIG. 2. The loss of resolution required to delineate the small pattern features of 0.1 $\mu$m or 100 nm must be held within a control of 10%; which requirement is part of the ground rules. Presently available programs for computer simulation of the interaction effects predict an edge acuity at 30 $\mu$A (and other optimized operating conditions) of 70–140 nm, depending on the theory applied. Therefore, only for the lower value would it be marginally possible to delineate 100 nm features. In addition, Coulomb interactions will also cause increasingly noticeable subfield distortion as current is increased.

Figure 3:
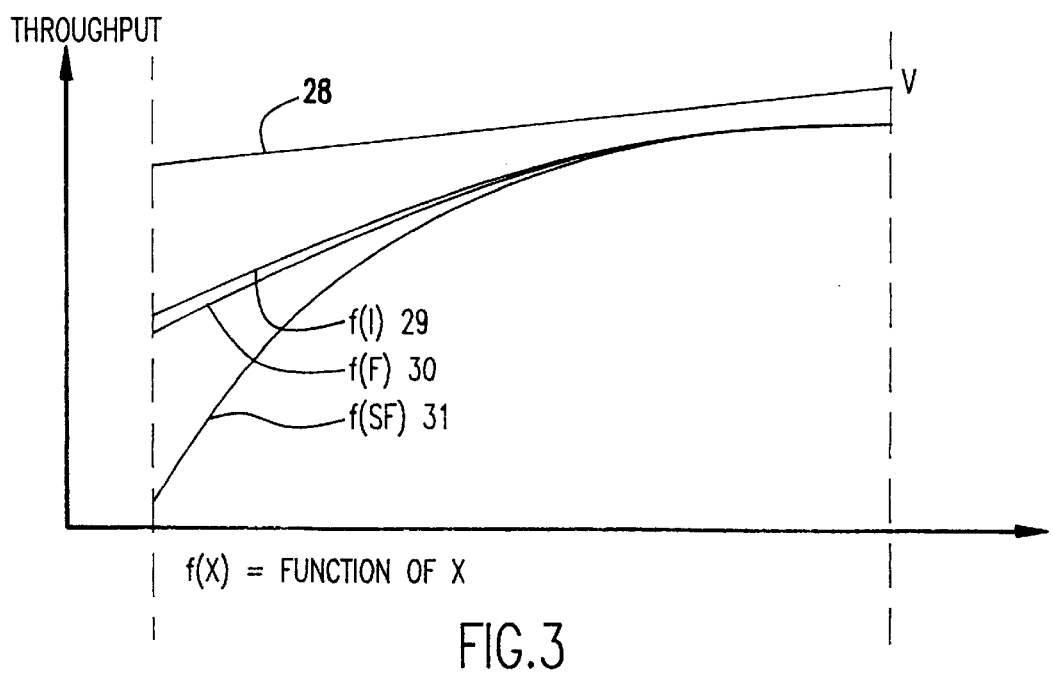
FIG. 3 is a graphical illustration of the general effects on throughput of sub-field size, field size/scan length, beam current and resist sensitivity.

In regard to return on investment, at otherwise reasonable assumptions for the system and operating parameters, a current increase of 100% (e.g. from 15 to 30 $\mu$A) results in a throughput increase of only about 20% (e.g. from 33 to 39 wafers/hr), as can be visualized from the relatively horizontal trace of f(I) at the right side of FIG. 3. The reason is that the overhead time increases faster than the exposure time decreases, primarily because of the lengthening stripe reversal times at the higher (reticle) stage speeds required to keep up with the beam. The higher stage speeds also increase the demand on positioning accuracy capability and synchronization with the wafer stage, which might adversely affect overlay although it should be noted that this limit on current would be significantly lifted with the use of the spinning reticle. Similarly, at 30 $\mu$A and 5 $\mu$C/cm$^2$ resist sensitivity, the exposure time is about equal to the settling time. Therefore, it would be illogical to increase the beam current much further in order to reduce exposure time. This ratio would get even worse at higher resist sensitivity (lower dose).

Further, at 100 kv and 30 $\mu$A the power input into the substrate is 3 watts, which may lead to a substantial increase of the resist temperature after exposure of several chips and correspondingly a sensitivity change resulting in loss of linewidth control. Additionally, above the reticle the power absorbed by aperture diaphragms is orders of magnitude higher than a few watts. This presents a serious engineering problem and potential loss of beam stability, ultimately resulting in loss of linewidth control and overlay accuracy.

The primary factors in determining a suitable range of scanning range/field size have been found to be throughput loss (imposing a lower limit), as shown at f(F) 30 of FIG. 3 and the effects on geometric aberrations (23 and 24 of FIG. 2), imposing an upper limit. To maintain throughput at the above-noted exemplary level, the product of scan length and stage speed must be of a given magnitude. This infers that both quantities are inversely proportional to each other. This inverse proportionality, in turn, infers that the lower limit on scanning range currently lies just above 20 mm at the present state of the art and is primarily determined by reticle translation stage performance.

Further, at a demagnification of 4:1, a throughput of 30 wafers/hr cannot be attained with scanning ranges smaller than 20 mm under otherwise reasonable assumptions for the system and operating parameters. Due to the increased number of (smaller) stripes per chip, the number of stage reversals would increase as scanning range is reduced, forcing higher stage speeds to compensate for the increase of overhead, which in turn increases the individual reversal times needed to decelerate and accelerate the stages. This implies that the overhead changes faster than inverse proportionally to the scan range.

In regard to an upper limit on scanning range, geometric aberrations (24 of FIG. 2) increase with the deflection off-axis by the power of 1 to 4. In particular, subfield distortion increases rapidly with off-axis distance. While it is, in principle, possible to compensate by pre-distortion of the reticle pattern, it is highly undesirable to do so due to the potential variation of the magnitude of the distortion from tool to tool in a manufacturing line. Accordingly, an upper limit on scanning range of 50–60 mm at the reticle is preferred to contain geometric aberrations. Additionally, further restriction of the scanning range below the preferred upper limit may be necessary, since the fabrication of perfect deflectors which do not generate four-fold and other distortions, as implied above, may not be possible.

In regard to sub-field size (defined as that portion of the chip pattern imaged at any given time), a larger sub-field is favorable because at fixed operating conditions and for a given throughput, Coulomb interactions are lower since the current can be reduced. Even at constant current, Coulomb interactions change roughly inversely of the square root of the subfield size. However, geometric aberrations increase with subfield size. These trends are depicted by trace 25 in FIG. 2. In particular, distortions increase rapidly with sub-field size as they do with scanning field size. leading to errors in stitching of subfields. Again, compensation by predistortion of the reticle is theoretically possible but not considered to be desirable since residual errors which cannot be avoided are even more significant and sensitive to change from tool-to-tool as subfield size increases than for deflection distortion as scanning range increases. Accordingly, the preferred upper limit on subfield size is about 400 μm to contain geometric aberrations and subfield distortions.

The lower limit on subfield size range is also affected by scan length or range to maintain throughput, as indicated by f(SF) 31 of FIG. 3, since the number of subfields within a chip is determinative of the number of required exposures per chip and corresponding overhead time per exposure and, hence, the throughput of the tool. Further, for a given current sufficient to avoid throughput loss, as discussed above, a decrease of subfield size increases loss of resolution due to increased Coulomb interactions (again as illustrated by trace 25 proceeding from right to left in FIG. 2). Accordingly, a preferred lower limit on subfield size is considered to be about 100 μm or 0.1 mm. Further, as sub-field size is decreased, blurring due to Coulomb interaction increases faster than geometric aberrations decrease and adequate resolution for lithography of features smaller than 0.15 μm can be lost if the subfield size is not maintained between about 100 and 400–500 μm. Therefore, for any given set of performance requirements in this feature size regime, an optimum subfield size must be established within these limits.

The numerical aperture is defined as the beam convergence semi-angle at the wafer and a suitable value of the numerical aperture is determined principally by the counter-dependencies of Coulomb interactions and geometric aberrations. For a given beam current, geometric aberrations causing image blur are roughly proportional to the numerical aperture while the Coulomb interactions are roughly inversely proportional to the numerical aperture by the power of $2/3$. (Conversely, low numerical apertures, usually below 2 milliradians, have been considered preferable to minimize geometric aberrations at currents less than a few μA which are suitable for probe-forming systems or the projection of subfields smaller than about 50 μm but unsuitable for exposure of areas of a size necessary for high throughput e-beam projection.) Thus, as can be visualized from the minimum exhibited by trace 26 in FIG. 2, Coulomb interaction blurring increases while geometric aberrations diminish with decreasing numerical aperture and unacceptable loss of resolution will occur if the numerical aperture is not kept above 2 and within a narrow range. Further, increased numerical aperture (NA) reduces depth of Focus (DOF). DOF is approximately given by the equation $$E^2 = E_o^2 + (2 \times NA \times DOF)^2$$

where $E_o$ is the edgewidth (or blur) of the feature at best focus. For example, for an acceptable 20% increase of an edgewidth of 0.1 μm and a numerical aperture of 8 mrad, the depth of focus is a mere 4 μm which may not be adequate under certain circumstances.

Balancing these aberrations, an optimum is found within a suitable range of numerical aperture between 3 and 8 milliradians which can only be achieved with an electron source of low brightness and high emittance (defined as the product of the beam diameter and the convergence/divergence angle at any point in the beam which is conserved throughout the system) as disclosed in the above-incorporated U.S. Pat. No. 5,633,507.

The fundamentally important factor is the width of the narrowest beam cross-section between the reticle and the wafer which occurs at the image of the source or entrance pupil of the system between the lenses of the system (e.g. at aperture 70), usually referred to as the cross-over. A larger cross-section of the beam at the cross-over requires a larger emittance from the electron source at a given system length and reduces Coulomb interactions.

In this regard, it should be understood that both brightness and emittance are so-called quantities of conservation since their values will be the same at all locations along the beam path. However, strictly speaking, the values will only be exact if the system is free of aberrations and obstacles, such as apertures, which cut off or interrupt a portion of the beam. In the absence of aberrations and obstacles to the beam (and, for simplicity, taking the target plane as the reference and, in some cases omitting the constant $n^2$) the following relationships exist:

$$B = I/E^2,$$

$$E = F^{1/2} \times NA$$

and $$J = I/F = I/E^2 \times NA^2 = b \times NA^2$$

where B=brightness, E=emittance, I=current, J=current density, NA=numerical aperture and F=beam cross-sectional area or subfield area at the target. Therefore, for a given brightness, subfield size and numerical aperture, current density decreases with increased emittance.

Optical reduction is also referred to as demagnification factor and is limited to a narrow range centered around a (linear) reduction of 4:1. The lower limit is about 3:1, principally dictated by difficulty in forming the reticle at high resolution. Both geometric aberrations and Coulomb interactions decrease about proportionally to the reduction ratio (i.e. a larger optical reduction factor corresponds to a lower electron density in the electron beam over most of the column length of the system).

The upper limit of about 5:1 is primarily given by practical reticle size relative to the size of wafers available for the fabrication of reticles. The limits on scan range, discussed above, also limit the number of sub-field exposures which can be made consistent with throughput since beam. deflection over the reticle must increase proportionately with reduction factor and reticle size and impose a practical limit on optical reduction to cover a given chip area with a given sub-field and reticle size.

Figure 2:
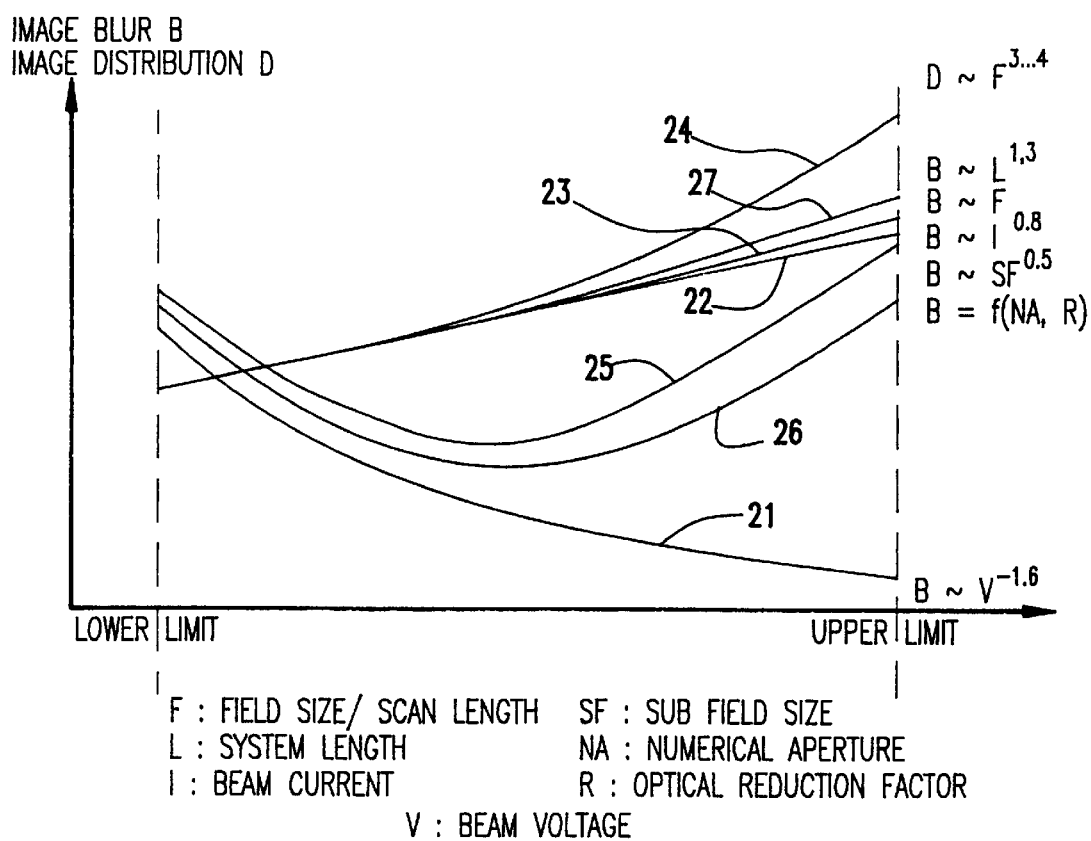
FIG. 2 is a graphical illustration of the general effects on resolution of various operating parameters of an electron beam projection system.

Coulomb interactions will occur over the entire beam column length and increase proportionally to the power of 1.3 thereto, as shown in trace 27 of FIG. 2. Geometric aberrations also increase significantly with column length above 1000 mm even though deflection aberrations decrease since they are overcompensated by on-axis aberrations. The distance from the reticle to the wafer should thus be kept as short as possible. Since the lenses must have relatively large pole piece dimensions to accommodate the required scan length/range limits discussed above, interaction of the lenses is unavoidable. The overlap of the lens fields cause the beam path to be curved over the entire length of the system. As a consequence, one skilled in the art would expect increased geometric aberrations with shortening of the system length.

The above-incorporated U.S. Pat. No. 5,635,719 describes a technique by which these adverse consequences can be avoided. However, a practical minimum length is established by the space required for the lenses and other electron-optical elements such as deflectors, correctors and the like. Accordingly, the minimum practical length of a system providing the beam scanning range adequate to achieve at least the exemplary throughput alluded to above and which is possible to attain only through use of a curvilinear axis as described in the above-incorporated U.S. Patent and Patent Applications is estimated to be about 500 mm.

In view of the foregoing, it is seen that an EBPS operating in accordance with the invention will provide an electron beam projection lithographic exposure tool having throughput comparable to optical projection lithography at feature size regimes of 0.18 μm and below. Specifically, in accordance with the invention, subfield sizes and optical reduction must be kept within relatively narrow ranges while significantly larger ranges may be employed for beam voltage and current, scanning range and numerical aperture. Suitable beam current and voltage ranges lie principally where overlay error is not a significant factor. Scanning range may be kept within practical limits while minimizing performance requirements for wafer and, possibly, reticle translation system performance by orthogonal orientation of beam scanning and wafer/reticle translation directions and providing for continuous motion of the latter.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An electron beam projection system for making lithographic exposures including
    means for scanning an electron beam orthogonally to a direction of motion of a target, and
    means for exposing a portion of a reticle with an electron source image, said portion of said reticle corresponding to an image at said target having a transverse dimension of at least approximately 0.1 mm at a numerical aperture greater than 2 milliradians and a beam current of between 4 and approximately 35 microamperes
    whereby resolution of said exposures at said target corresponds to a lithographic feature size of 0.18 micrometers or smaller are produced at a throughput corresponding to exposure of at least 30 wafers of 200 mm diameter per hour.

2. A system as recited in claim 1, wherein said transverse dimension of said image at said wafer is between approximately 0.1 mm and approximately 0.4 mm.

3. A system as recited in claim 1, wherein said transverse dimension of said image at said wafer is between approximately 0.25 mm and approximately 0.5 mm.

4. A system as recited in claim 1, having a numerical aperture in the range of approximately 3 milliradians to approximately 8 milliradians.

5. A system as recited in claim 1, wherein a length of said electron beam is at least approximately 500 mm.

6. A system as recited in claim 4, wherein a length of said electron beam is at least approximately 500 mm.

7. A system as recited in claim 1, further including
    means for scanning said electron beam over a field size having a maximum transverse dimension of approximately 55 mm.

8. A system as recited in claim 4, further including
    means for scanning said electron beam over a field size having a maximum transverse dimension of approximately 55 mm.

9. A system as recited in claim 6, further including
    means for scanning said electron beam over a field size having a maximum transverse dimension of approximately 55 mm.

10. A system as recited in claim 1, further including
    means for providing an optical reduction factor of an image of said reticle at said target of between approximately 3:1 and approximately 5:1.

11. A system as recited in claim 1, further including
    means for providing an accelerating voltage of between 75 kV and 150 kV.

12. A system as recited in claim 1, further including
    means for continuously moving said target.

13. A system as recited in claim 1, further including
    means for continuously moving said reticle.

14. A system as recited in claim 1, further including
    means for continuously rotating said reticle about an axis.

15. A system as recited in claim 12, further including
    means for continuously moving said reticle.

16. A system as recited in claim 12, further including
    means for continuously rotating said reticle about an axis.

17. A method of operating an electron beam projection system for making lithographic exposures including the steps of
    scanning an electron beam orthogonally to a direction of motion of a target,
    exposing a portion of a reticle with an electron source image, said portion of said reticle corresponding to an image at said target having a transverse dimension of at least approximately 0.1 mm at a numerical aperture greater than 2 milliradians with a beam current of between approximately 4 and approximately 35 microamperes,
    whereby resolution of said exposures at said target corresponds to a lithographic feature size of 0.18 micrometers or smaller and said exposures are produced at a throughput corresponding to exposure of at least 30 wafers of 200 mm diameter per hour.

18. A method as recited in claim 17, including the further step of
    scanning said electron beam over a field size having a maximum transverse dimension of approximately 55 mm.

\* \* \* \* \*